(12) United States Patent
Xie et al.

(10) Patent No.: US 10,985,073 B2
(45) Date of Patent: Apr. 20, 2021

(54) VERTICAL FIELD EFFECT TRANSISTOR REPLACEMENT METAL GATE FABRICATION

(71) Applicant: International Business Machines Corporation, Armonk, NY (US)

(72) Inventors: Ruilong Xie, Niskayuna, NY (US); Wenyu Xu, Albany, NY (US); Brent Alan Anderson, Jericho, VT (US); Zuoguang Liu, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 16/504,849

(22) Filed: Jul. 8, 2019

(65) Prior Publication Data
US 2021/0013106 A1    Jan. 14, 2021

(51) Int. Cl.
*H01L 21/8234* (2006.01)
*H01L 29/78* (2006.01)
*H01L 27/088* (2006.01)

(52) U.S. Cl.
CPC ........ *H01L 21/823487* (2013.01); *H01L 21/823418* (2013.01); *H01L 21/823437* (2013.01); *H01L 21/823462* (2013.01); *H01L 21/823475* (2013.01); *H01L 21/823481* (2013.01); *H01L 27/088* (2013.01); *H01L 29/7827* (2013.01)

(58) Field of Classification Search
CPC ..... H01L 21/823487; H01L 21/823475; H01L 21/823437; H01L 21/823462; H01L 21/823481; H01L 29/7827; H01L 21/823418; H01L 27/088
See application file for complete search history.

(56) References Cited

U.S. PATENT DOCUMENTS

| | | | |
|---|---|---|---|
| 6,566,682 B2 | 5/2003 | Forbes | |
| 6,597,203 B2 | 7/2003 | Forbes | |
| 6,900,521 B2 | 5/2005 | Forbes et al. | |
| 7,446,025 B2 | 11/2008 | Cohen et al. | |
| 9,525,064 B1 | 12/2016 | Balakrishnan et al. | |
| 9,530,863 B1 | 12/2016 | Zhang et al. | |
| 9,640,636 B1 | 5/2017 | Bentley et al. | |
| 9,691,877 B2 | 6/2017 | Basker et al. | |
| 9,837,405 B1 * | 12/2017 | Cheng | H01L 21/31111 |

(Continued)

*Primary Examiner* — Karen Kusumakar
*Assistant Examiner* — Adam S Bowen
(74) *Attorney, Agent, or Firm* — Douglas Pearson; Ryan, Mason & Lewis, LLP

(57) ABSTRACT

A method for fabricating a semiconductor device includes forming a semiconductor structure including a substrate, a first vertical fin and a second vertical fin longitudinally spaced from the first vertical fin with each of the first and second vertical fin having a hardmask cap, and a bottom spacer layer on the substrate. The method further includes forming first and second bottom source/drains within the substrate respectively beneath the first and second vertical fins, forming first and second top source/drains respectively on the first and second vertical fins, forming a vertical oxide pillar between the first and second vertical fins, removing a portion of the oxide pillar to reduce a cross-sectional dimension to define a lower recessed region, and depositing a metal gate material about the first and second vertical fins wherein portions of the metal gate material are disposed within the recessed region of the oxide pillar.

20 Claims, 14 Drawing Sheets

(56) References Cited

U.S. PATENT DOCUMENTS

| | | |
|---|---|---|
| 9,859,421 B1 | 1/2018 | Robison et al. |
| 9,882,047 B2 | 1/2018 | Leobandung |
| 2017/0222045 A1 | 8/2017 | Leobandung |
| 2018/0019337 A1 | 1/2018 | Xie et al. |
| 2018/0083136 A1* | 3/2018 | Xie .................... H01L 29/7827 |
| 2018/0090504 A1* | 3/2018 | Balakrishnan .............................. H01L 21/823487 |
| 2018/0254330 A1 | 9/2018 | Bao et al. |

* cited by examiner

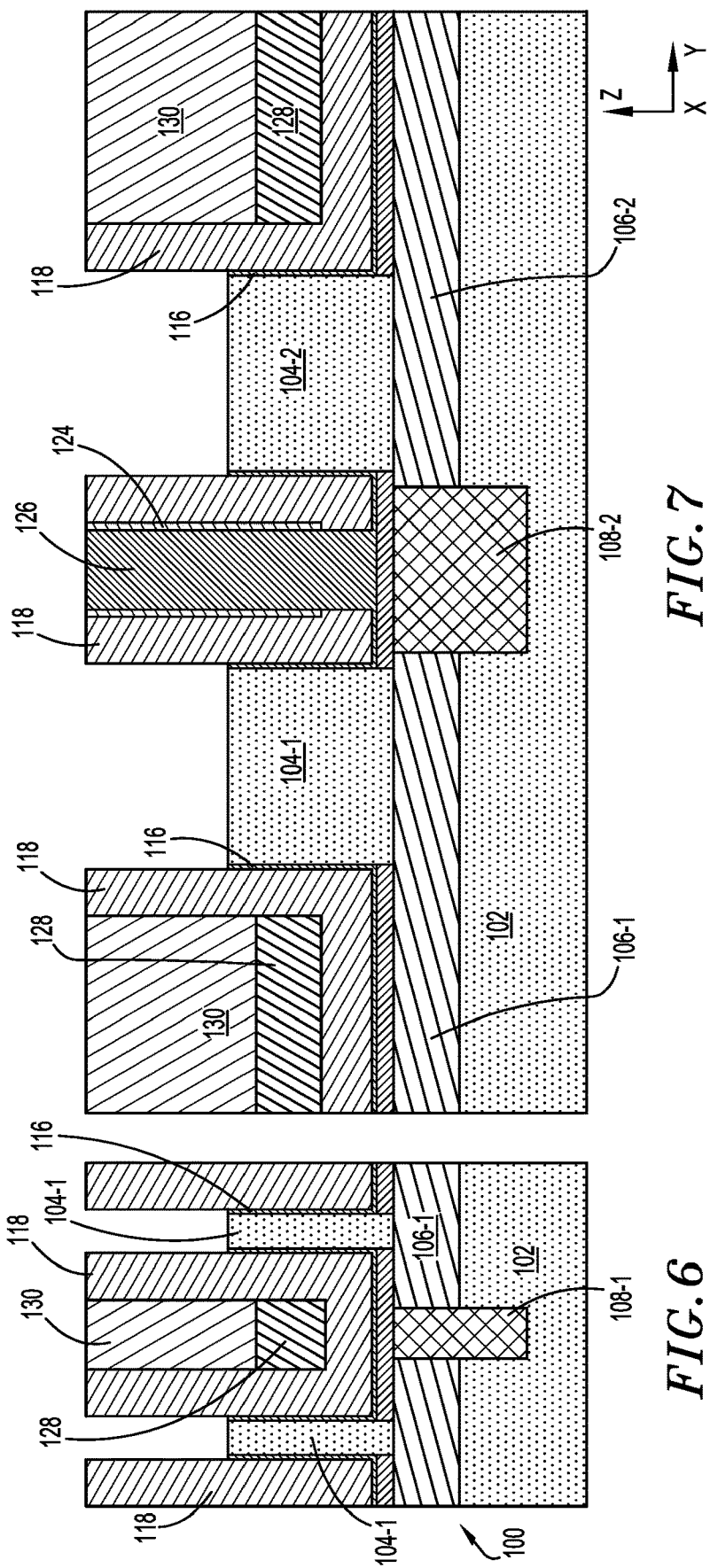

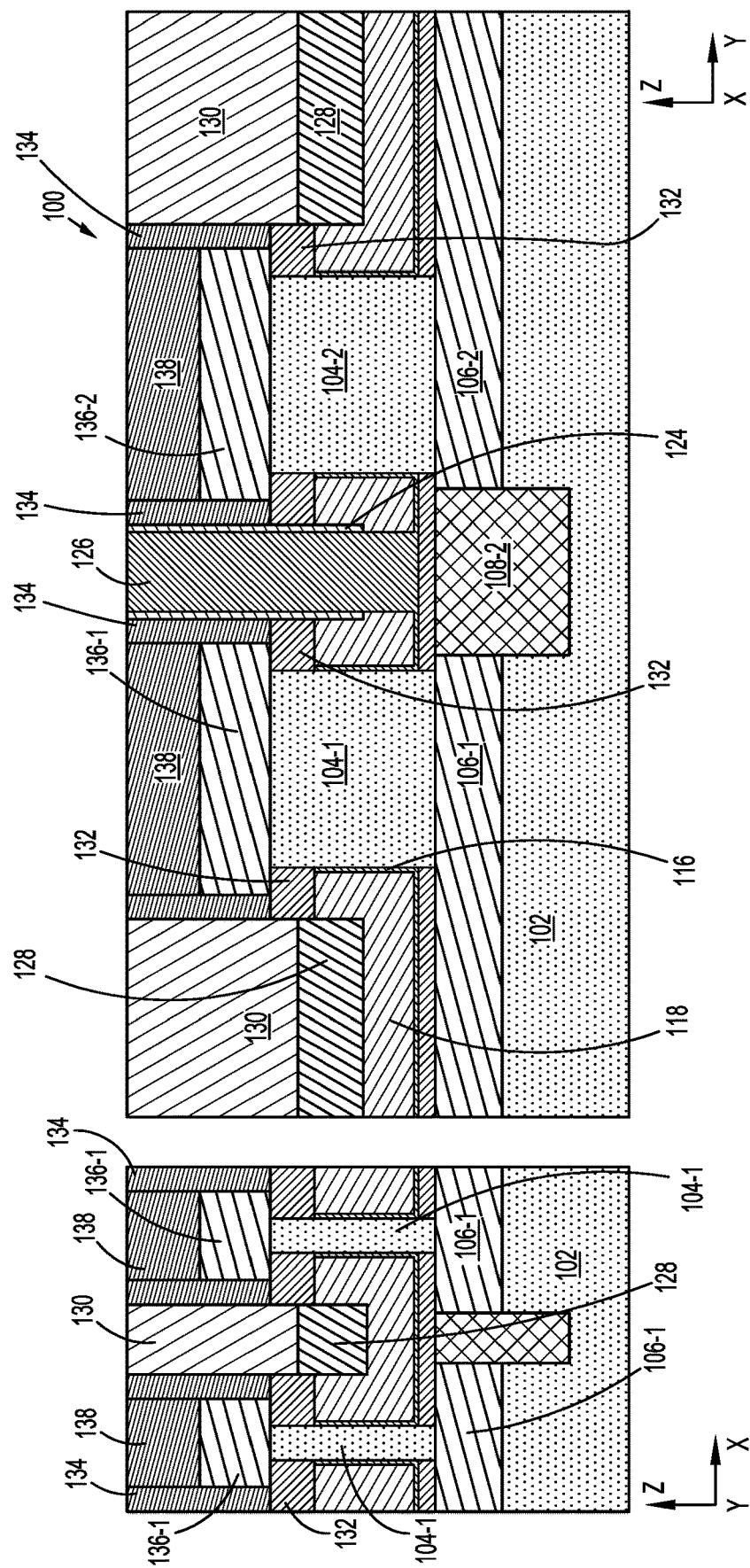

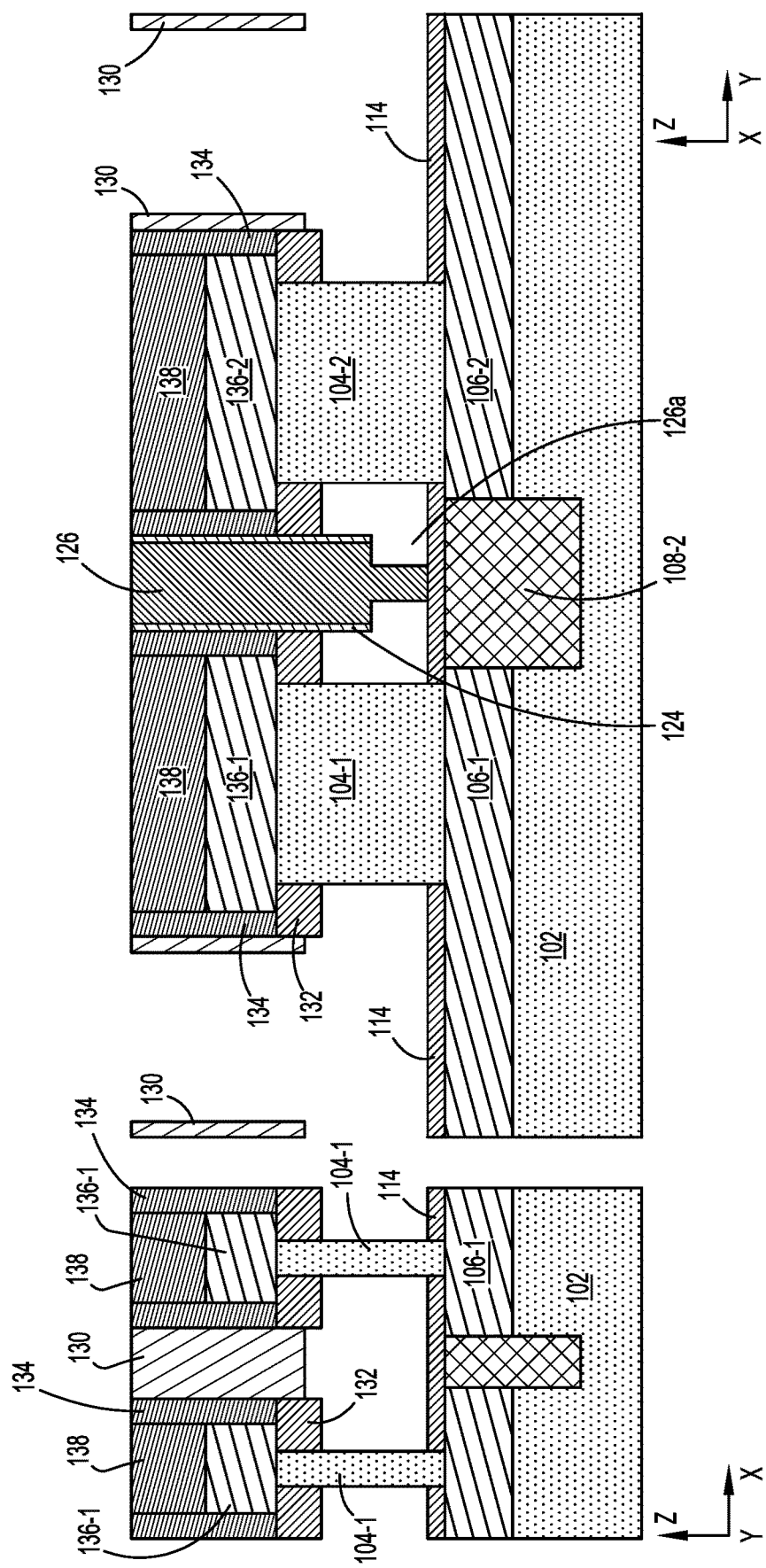

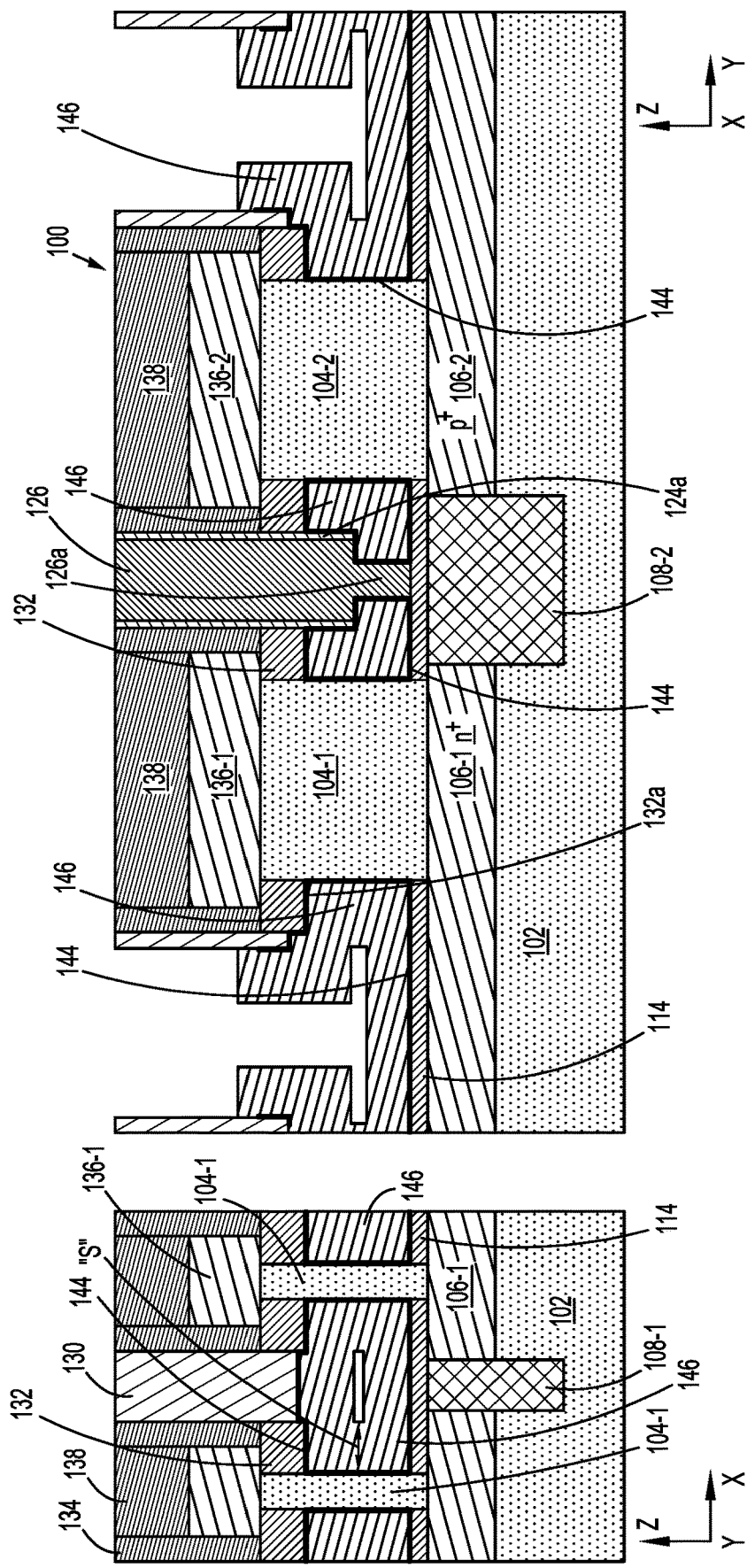

VERTICAL FIELD EFFECT TRANSISTOR REPLACEMENT METAL GATE FABRICATION

BACKGROUND

The present disclosure relates generally to semiconductor devices, and more specifically, to a vertical field effect transistor (VFET) device including a high-k metal gate (HKMG) stack defined by a replacement metal gate (RMG) process.

A vertical field effect transistor (VFET) device includes a vertical fin extending from a semiconductor substrate. The vertical fin forms a vertical channel extending between a source region and a drain region of the semiconductor. In general, a VFET device is designed to have one or more gates that are formed on multiple sides of the vertical channel (e.g., a vertical semiconductor fin or vertical nanowire). In addition, a VFET device employs doped source and drain regions. The doped source region for a VFET device may be formed on top of a vertical semiconductor fin, and the doped drain region may be formed underneath the vertical semiconductor fin. The opposite arrangement is also feasible. The gates of the VFET device control the flow of electric current through the channel and between the source and drain regions. The perpendicular arrangement of the vertical fin in a VFET device increases packing density and improves scaling limitations relative to a conventional field effect transistor (FET).

SUMMARY

In illustrative embodiments, a VFET device is fabricated via a methodology which decreases the overall scaling of the VFET device while ensuring that sufficient volume is provided for a high-k metal gate (HKMG) stack. In one or more illustrative embodiments, a VFET fabrication process is defined that is compatible with tight fin and insulative pitches to facilitate multi-VFET processing.

Illustrative embodiments comprise a method for fabricating a semiconductor device. The method comprises forming a semiconductor structure including a substrate defining a longitudinal axis, a first vertical fin and a second vertical fin longitudinally spaced from the first vertical fin, and a bottom spacer layer on the substrate. Each of the first and second vertical fins has a hardmask cap. The method further includes forming a first bottom source/drain within the substrate beneath the first vertical fin and a second bottom source/drain within the substrate beneath the second vertical fin, forming a first top source/drain on the first vertical fin and a second top source/drain on the second vertical fin, forming a vertical oxide pillar between the first and second vertical fins, removing a portion of the oxide pillar to reduce a cross-sectional dimension of a lower end of the oxide pillar to define a recessed region of the oxide pillar, and depositing a metal gate material about the first and second vertical fins wherein portions of the metal gate material are disposed within the recessed region of the oxide pillar.

In another illustrative embodiment, a method for fabricating a semiconductor device comprises forming a first vertical fin and a second vertical fin on a substrate of a semiconductor structure where the substrate defines a longitudinal axis and wherein the first and second vertical fins are longitudinally spaced, and forming a first metal gate structure around the first vertical fin and a second metal gate structure around the second vertical fin. Each of the metal gate structures has a gate segment defining a L-shaped profile configured to increase surface area for landing of a gate contact.

In another illustrative embodiment, a semiconductor device comprises a substrate including first and second longitudinally spaced vertical fins extending vertically from the substrate, first and second bottom source/drains beneath the first and second vertical fins, respectively, a shallow trench isolation region within the substrate between the first and second bottom source/drains, first and second top source/drains on the first and second spaced vertical fins, respectively, and a metal gate structure disposed about each of the first and second vertical fins. At least a gate segment of each of the metal gate structures defines a L-shaped profile. The gate segments are adjacent to each other and are configured to provide a landing having an increased surface area for a gate contact.

BRIEF DESCRIPTION OF THE DRAWINGS

FIGS. 1-20 schematically illustrate methods for fabricating a semiconductor structure including one or more VFETs according to one or more illustrative embodiments.

FIG. 1 is a top plan view of the semiconductor structure illustrating the substrate and first and second pairs of vertical fins extending upwardly from the substrate at an initial stage of fabrication of the semiconductor structure according to one or more illustrative embodiments.

FIG. 2 is a cross-sectional view along the x-axis of FIG. 1 illustrating the semiconductor structure including the substrate and the first pair of vertical fins extending from the substrate at a first intermediate stage of fabrication of the semiconductor structure according to one or more illustrative embodiments.

FIG. 3 is a cross-sectional view along the y-axis of FIG. 1 illustrating the semiconductor structure and individual vertical fins of the first and second pairs at the first intermediate stage of fabrication of the semiconductor structure according to one or more illustrative embodiments.

FIG. 4 is a cross-sectional view along the y-axis of the semiconductor structure of FIG. 3 at a second intermediate stage of fabrication of the semiconductor structure according to one or more illustrative embodiments.

FIG. 5 is a cross-sectional view along the y-axis of the semiconductor structure of FIG. 4 at a third intermediate stage of fabrication of the semiconductor structure according to one or more illustrative embodiments.

FIG. 6 is a cross-sectional view along the x-axis of the semiconductor structure of FIG. 5 at a fourth intermediate stage of fabrication of the semiconductor structure according to one or more illustrative embodiments.

FIG. 7 is a cross-sectional view along the y-axis of the semiconductor structure of FIG. 6 at the fourth intermediate stage of fabrication of the semiconductor structure according to one or more illustrative embodiments.

FIG. 8 is a cross-sectional view along the y-axis of the semiconductor structure of FIG. 7 at a fifth intermediate stage of fabrication of the semiconductor structure according to one or more illustrative embodiments.

FIG. 9 is a cross-sectional view along the x-axis of the semiconductor structure of FIG. 8 at a sixth intermediate stage of fabrication of the semiconductor structure according to one or more illustrative embodiments.

FIG. 10 is a cross-sectional view along the y-axis of the semiconductor structure of FIG. 9 at the sixth intermediate stage of fabrication of the semiconductor structure according to one or more illustrative embodiments.

FIG. 11 is a cross-sectional view along the y-axis of the semiconductor structure of FIG. 10 at a seventh intermediate stage of fabrication of the semiconductor structure according to one or more illustrative embodiments.

FIG. 12 is a cross-sectional view along the x-axis of the semiconductor structure of FIG. 11 at an eighth intermediate stage of fabrication of the semiconductor structure according to one or more illustrative embodiments.

FIG. 13 is a cross-sectional view along the y-axis of the semiconductor structure of FIG. 12 at the eighth intermediate stage of fabrication according to one or more illustrative embodiments.

FIG. 14 is a cross-sectional view along the x-axis of the semiconductor structure of FIG. 13 at a ninth intermediate stage of fabrication of the semiconductor structure according to one or more illustrative embodiments.

FIG. 15 is a cross-sectional view along the y-axis of the semiconductor structure of FIG. 14 at the ninth intermediate stage of fabrication of the semiconductor structure according to one or more illustrative embodiments.

FIG. 16 is a cross-sectional view along the y-axis of the semiconductor structure of FIG. 15 at a tenth intermediate stage of fabrication of the semiconductor structure according to one or more illustrative embodiments.

FIG. 17 is a cross-sectional view along the y-axis of the semiconductor structure of FIG. 16 at an eleventh intermediate stage of fabrication according to one or more illustrative embodiments.

FIG. 18 is a cross-sectional view along the x-axis of the semiconductor structure of FIG. 17 at one final stage of fabrication of the semiconductor structure according to one or more illustrative embodiments.

FIG. 19 is a cross-sectional view along the y-axis of the semiconductor structure of FIG. 18 at the one final stage of fabrication of the semiconductor structure according to one or more illustrative embodiments.

FIG. 20 is a cross-sectional view along the x-axis of an alternate semiconductor structure at one final stage of fabrication of the semiconductor structure according to one or more illustrative embodiments.

DETAILED DESCRIPTION

Figure 1:
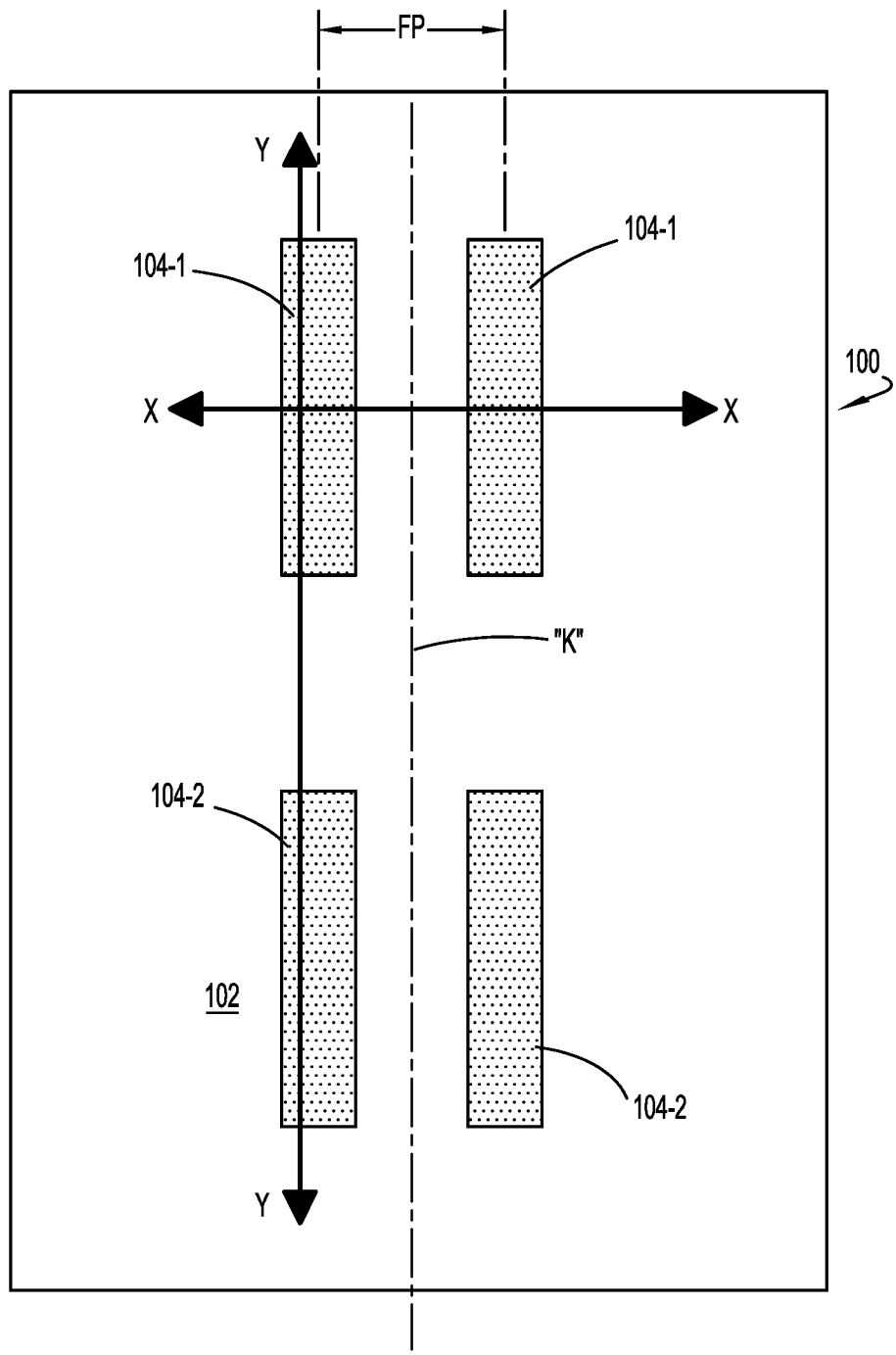

Illustrative embodiments of the disclosure will now be described with regard to methods for fabricating semiconductor substrates with uniform structural profiles, as well as semiconductor devices comprising one or more VFETs with uniform structural profiles. Semiconductor fabrication methods for VFETs according to illustrative embodiments implement a process flow to fabricate vertical dummy gates within isolation regions, which enables the formation of VFETs with uniform structural profiles and reduced scaling. For example, as explained in further detail below, an illustrative process creates sufficient volume or space for deposition of a high-k metal gate (HKMG) stack having sufficient thickness and surface patterning to provide conductive channels well adapted to perform the functioning of the VFET device while addressing scaling issues and enhancing coupling with a subsequently formed gate contact.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, e.g., wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure is not to be interpreted as requiring direct contact of the components for it is possible one or more intermediate components, layers or coatings may be positioned between the select components unless otherwise specified. More specifically, positional relationships, unless specified otherwise, can be direct or indirect, and the present disclosure is not intended to be limiting in this respect.

As previously noted herein, for the sake of brevity, conventional techniques related to semiconductor device and integrated circuit (IC) fabrication may or may not be described in detail herein. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor structure including a VFET device according to illustrative embodiments utilize a variety of individually known physical and chemical processes performed on a semiconductor (e.g., silicon) substrate, some of which are described in the immediately following paragraphs.

In the discussion that follows, the semiconductor structure, which will incorporate one or more VFET devices, will be referred to as the "semiconductor structure 100" throughout the various stages of fabrication, as represented in all the accompanying drawings.

Methods for fabricating a semiconductor structure 100 comprising one or more VFET devices will now be discussed in further detail with reference to FIGS. 1 through 20, which schematically illustrate a semiconductor structure 100 incorporating one or more VFET devices at various stages of fabrication. With initial reference to FIG. 1, there is schematically illustrated, in a top plan view, a semiconductor structure 100 at an early stage of fabrication. At this stage of fabrication, the semiconductor structure 100 includes a substrate 102 defining a longitudinal axis "K" and first and second pairs of vertical fins 104-1, 104-2 extending upwardly from the substrate 102. The vertical fins 104-1, 104-2 each define a longitudinal length along the y-axis which may or not be the same for each of the vertical fins 104-1, 104-2. Longitudinally adjacent vertical fins 104-1, 104-1 of the first pair define a fin pitch "FP" which is the distance between the centers of the longitudinally adjacent vertical fins 104-1, 104-1. The fin pitch may range from 28 to 36 nanometers (nm) or about 32 nm. For exemplative purposes, the top pair of vertical fins 104-1 in FIG. 1 may be incorporated within, e.g., an intended n-type VFET region of the semiconductor structure 100, and the bottom pair of vertical fins 104-2 may be incorporated within, e.g., a p-type VFET region of the semiconductor structure. The opposite arrangement is also possible. In addition, as appreciated, the semiconductor structure 100 may incorporate many sets of vertical fins 104-1, 104-2 extending from the substrate 102.

Figure 3:
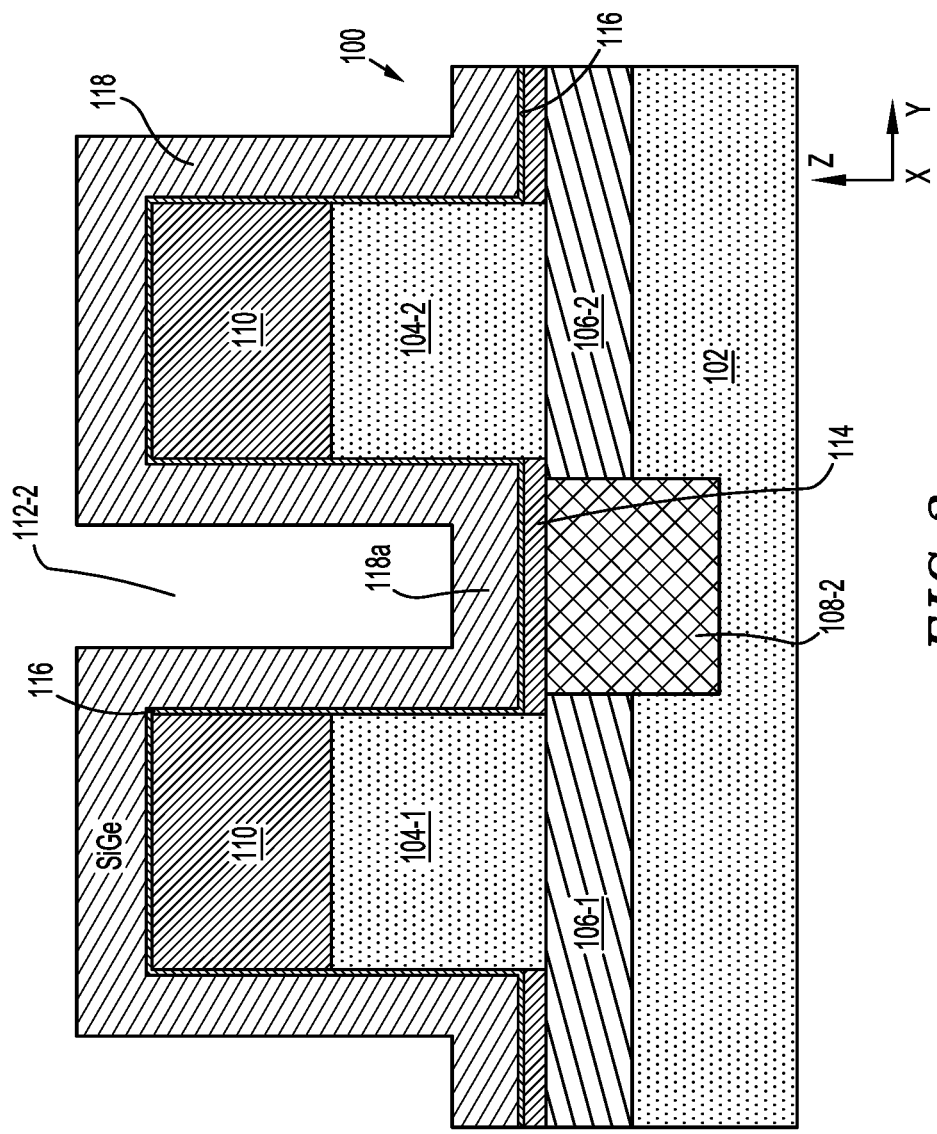
Figure 2:
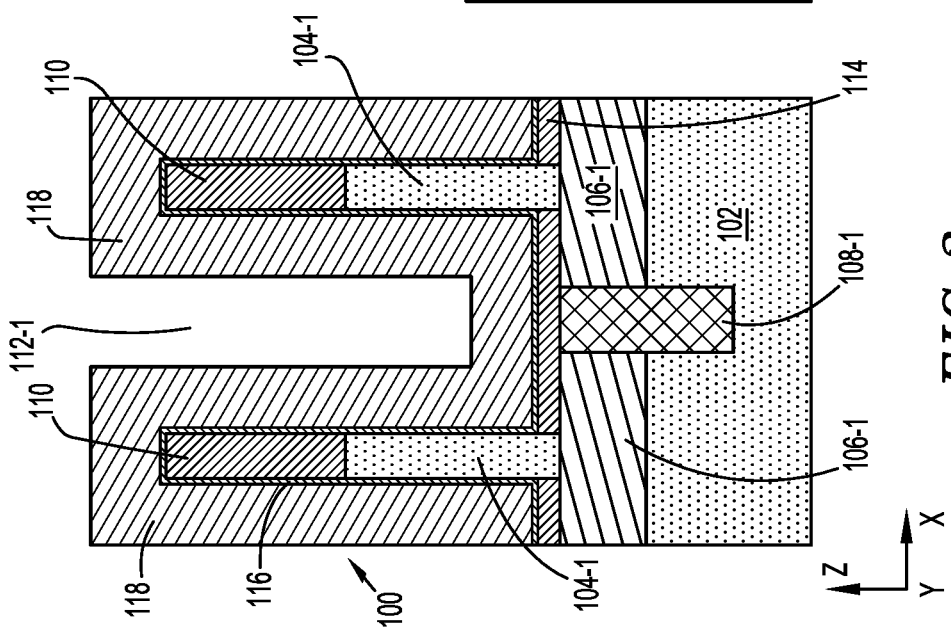

With reference now to FIGS. 2 and 3, which are cross-sectional views of the semiconductor structure 100 along the x-axis and y-axis of FIG. 1, respectively, the semiconductor structure 100 is illustrated at an intermediate stage of fabrication where several processes have been previously performed. At this stage of fabrication, the semiconductor structure 100 includes the substrate 102, the pairs of vertical fins 104-1, 104-2 extending upwardly from the substrate 102 and bottom source/drain regions 106-1, 106-2 disposed beneath the respective pairs of vertical fins 104-1, 104-2. For exemplative purposes, the bottom source/drain regions 106-1, 106-2 of FIG. 3 may have different polarities. For example, the bottom source/drain region 106-1 may have an n-type polarity and the bottom/source drain region 106-2 may have a p-type polarity. A shallow trench isolation (STI) region 108-1 is disposed between longitudinally adjacent vertical fins 104-1, 104-1 of the first pair (FIG. 2) and a shallow trench isolation (STI) region 108-2 is disposed between longitudinally aligned, and longitudinally spaced, vertical fins 104-1, 104-2 of the respective first and second pairs of vertical fins 104-1, 104-2 (FIG. 3).

The semiconductor substrate 102 may comprise a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the semiconductor substrate 102 may comprise an active semiconductor layer (e.g., silicon layer, SiGe layer, III-V compound semiconductor layer, etc.) of a SOI (silicon on insulator) substrate, which comprises an insulating layer (e.g., oxide layer) disposed between a base substrate layer (e.g., silicon substrate) and the active semiconductor substrate 102 in which active circuit components (e.g., VFET devices) are formed as part of a front-end-of-line (FEOL) layer.

The vertical fins 104-1, 104-2 are generally normal to, or perpendicular to, the substrate 102. Each of the vertical fins 104-1, 104-2 includes a fin cap 110 at an upper end thereof. In various embodiments, the vertical fins 104-1, 104-2 each may have a width along the x-axis in the range of about 4 nm to about 40 nm, or can have a width in the range of about 8 nm to about 15 nm, or in the range of about 10 nm to about 12 nm. In various embodiments, the vertical fins 104-1, 104-2 may have a height along the z-axis in the range of about 25 nm to about 75 nm, or in the range of about 30 nm to about 50 nm. Other dimensions of the vertical fins 104-1, 104-2 are also contemplated. The vertical fins 104-1, 104-2 may be formed simultaneously with the substrate 102 during the same patterning process, such as, self-aligned double patterning or self-aligned quadruple patterning. The vertical fins 104-1, 104-2 may be formed, e.g., by removing material from the substrate 102 using a photolithography process followed by an anisotropic etching process such as reactive ion etching (RIE) or plasma etching. Other methods of forming the vertical fins 104-1, 104-2 known in the art may also be utilized, such as sidewall image transfer (SIT) process.

The fin cap 110 disposed on the top of each vertical fin 104-1, 104-2 may be formed of any suitable material, e.g., a silicon nitride (SiN) hardmask material that has an etch resistance greater than that of the substrate 102 and at least some of the insulator materials used in the remainder of the processing of the semiconductor structure 100. The hardmask material forming the fin caps 110 is used to cover/protect the vertical fins 104-1, 104-2 during prior and subsequent etching processes. The hardmask material may be deposited on the vertical fins 104-1, 104-2 where excess hardmask material is etched away in an etching process leaving the fin caps 110 on the top of the vertical fins 104-1, 104-2. The vertical fins 104-1 of the first pair are separated by a trench opening 112-1 (FIG. 2) and the longitudinally aligned vertical fins 104-1 and 104-2 of the first and second pairs of fins are separated by a trench opening 112-2 (FIG. 3).

In illustrative embodiments, the bottom/source drain regions 106-1, 106-2 may be in-situ doped wherein dopants are incorporated into the bottom source/drain layers 106-1, 106-2 during epitaxial growth of the bottom source drain regions 106-1, 106-2. For example, for n-type VFET devices, the bottom source/drain layer 106-1 may comprise a doped epitaxial silicon (Si) material, and for p-type VFET devices, the bottom source/drain layer 106-2 may comprise a doped epitaxial silicon-germanium (SiGe) layer. It is to be understood that the term "source/drain region" as used herein means that a given source/drain region can be either a source region or a drain region, depending on the application or circuit configuration.

In other illustrative embodiments, the bottom source/drains regions 106-1, 106-2 may be formed via an ion implantation process(es). In one illustrative embodiment, the bottom source drain region 106-1 comprises N-type dopant atoms, while the bottom source drain region 106-2 comprises P-type dopant atoms, each formed by introducing dopant atoms during one or more ion implantation processes with the use of patterned implant masks (not shown). The implantation processes performed on the bottom/source drain regions 106-1, 106-2 may occur before or after the formation of the vertical tins 104-1, 104-2.

The STI regions 108-1, 108-2 may be formed by depositing a layer of insulating material, such as silicon oxide (SiO$_2$), to fill a previously etched shallow trench in the substrate 102, and then planarizing the overburden layer of silicon oxide (SiO$_2$) to recess the SiO$_2$ to thereby form the STI regions 108-1, 108-2 as shown in FIGS. 2 and 3. The STI regions 108-1, 108-2 each extend into the substrate 102 below their respective bottom source/drain layers 106-1, 106-2. In other illustrative embodiments, the STI regions 108-1, 108-2 are formed with multiple insulating materials, e.g., forming a silicon nitride (SiN) liner to line the shallow trench, and depositing a silicon oxide (SiO$_2$) material over the liner to fill the shallow trench.

With continued reference to FIGS. 2-3, the semiconductor structure 100 further includes a bottom spacer layer 114 which may be located near the bottom of the vertical fins 104-1, 104-2. The bottom spacer layer 114 may be made of any insulating material, such as silicon nitride (SiN), silicon oxide (SiO$_2$), silicon oxynitrides SiO$_x$N$_y$, or a combination thereof, and may have a thickness ranging from 4 nanometers (nm) to approximately 15 nm, or between about 5 nm to about 10 nm. In one illustrative embodiment, the bottom spacer layer 114 comprises silicon nitride (SiN). The bottom spacer 114 may be formed by any method known in the art, including directional deposition techniques.

A sacrificial oxide layer 116 is deposited onto the semiconductor structure 100 to envelop the vertical fins 104-1, 104-2, the fin caps 110, the surface of the semiconductor substrate 102 and the bottom spacer layer 114. In illustrative embodiments, the oxide layer 116 can be silicon oxide (SiO$_2$) or a silicon oxide/silicon borocarbonitride (SiBCN) bilayer, which can be deposited via a chemical vapor deposition (CVD) process, an atomic layer deposition (ALD) process, or a combination thereof. In some instances, the sacrificial oxide layer 116 is a dummy oxide as it defines a dummy gate. In addition, a sacrificial liner 118 formed of, e.g., silicon-germanium (SiGe), is disposed over the semiconductor structure 100 enclosing the vertical fins 104-1, 104-2 and the substrate 102. The sacrificial liner 118 is typically formed using a conformal deposition process. The term "conformal" denotes a layer having a thickness that does not deviate from greater than or less than 30% of an average value for the thickness of the layer. The sacrificial liner 18 can be formed using a deposition process, such as chemical vapor deposition (CVD), or the sacrificial liner 118 can be formed using an ALD process. Other materials including nitride may be used as the sacrificial liner 118.

Figure 4:
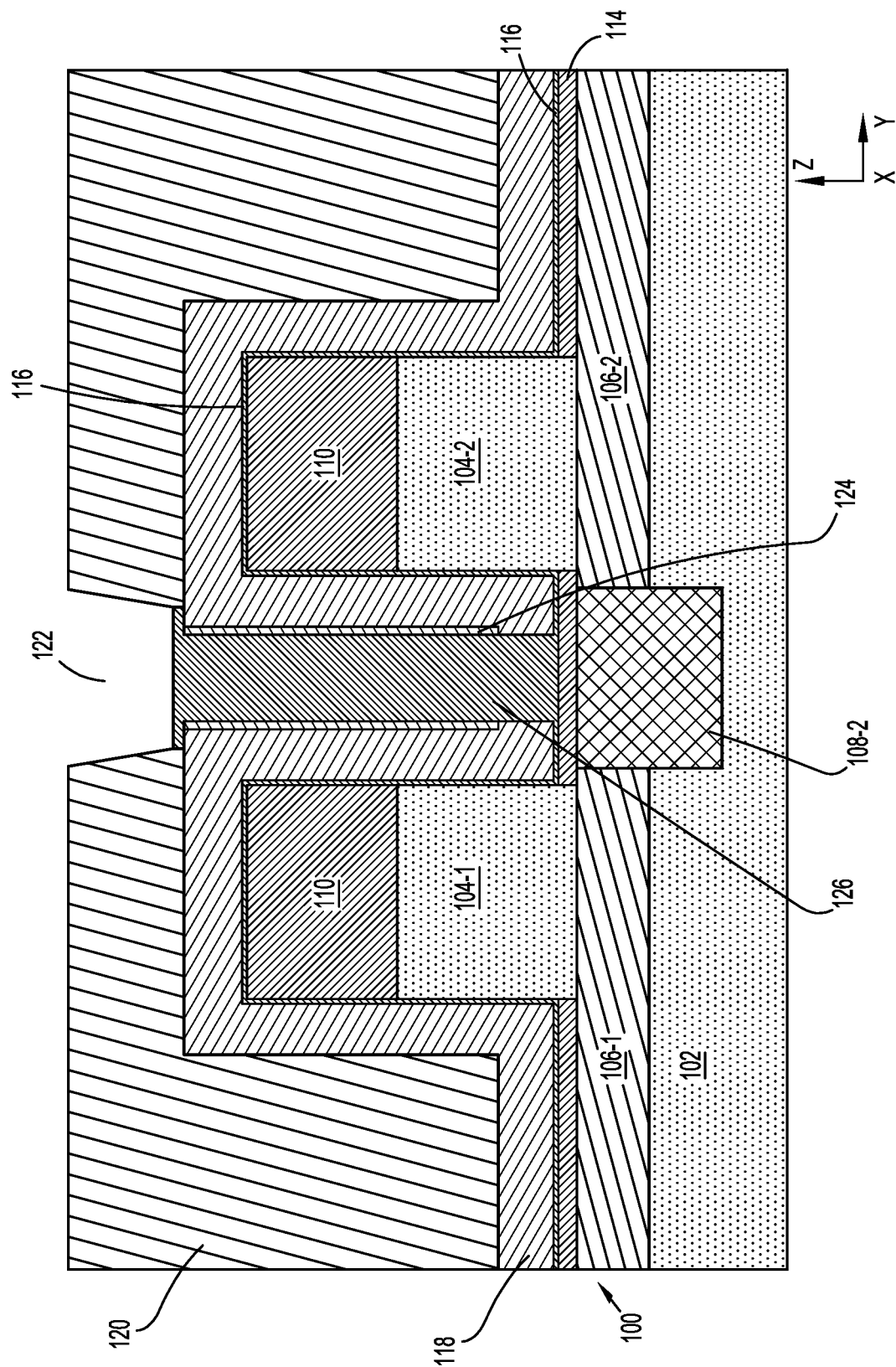

With reference now to FIG. 4, the process is continued by depositing a sacrificial material, e.g., an organic planarization layer (OPL) 120, onto the semiconductor structure 100 and the sacrificial liner 118 to fill the trench openings 112-1, 112-2 between the vertical fins 104-1, 104-2 and the sacrificial liner 118. The organic planarization layer (OPL) 120 is deposited from solution, e.g., by any conventional deposition process, and is baked at high temperatures. The organic planarization layer (OPL) 120 typically fills the trench openings 112-1, 112-2, and can extend beyond the upper surfaces of the sacrificial liner 118. In some instances, the organic planarization layer (OPL) 120 is self-leveling and achieves planarization over the surface topography without the use of etching, chemical mechanical polishing (CMP), or other conventional planarization techniques. In other instances, the organic planarization layer (OPL) 120 may require multiple deposition processes, etching processes or optionally a CMP process to planarize the organic planarization layer (OPL) 120. The organic planarization layer (OPL) 120 may have a thickness ranging from about 50 nm to about 500 nm.

With continued reference to FIG. 4, the organic planarization layer (OPL) 120 is subjected to a trench patterning procedure, e.g., conventional lithographic and etching processes utilizing, e.g., a reactive ion etching (RIE) process (with, e.g., a halogen-based plasma chemistry) between the aligned vertical fins 104-1, 104-2 of the first and second pairs to remove the organic planarization layer (OPL) 120 between the vertical fins 104-1, 104-2. The etching process is selective to the material of the sacrificial liner 118. In one illustrative embodiment, the trench opening created by the etching process is greater at its upper end 122 than the trench size defined between the sacrificial liner 118, i.e., the internal dimension of the sacrificial liner 118. The etch process self-aligns within the sacrificial liner 118 and the trench opening 112, which removes the organic planarization layer (OPL) 120 within the sacrificial liner 118 without, due to its selectivity, damaging the material of the sacrificial liner 118.

FIG. 4 also illustrates a spacer 124 positioned within the trench opening 112-2 between the sacrificial liner 118. In one illustrative embodiment, the spacer 124 is fabricated using a plasma enhanced atomic layer deposition (PEAL D) process. The spacer 124 may comprise any suitable material resistant to a RIE etching process, including, e.g., a boron-modified silicon carbonitride (SiBCN) having a thickness ranging from about 2 nm to 4 nm, or about 3 nm. The spacer 124 does not extend to the oxide layer 116 but is spaced a predetermined distance. The predetermined distance may range from about 5% to about 40% of the height of the oxide pillar 126. With the spacer 124 in place, a RIE etching process is utilized to remove the lower horizontal portion 118a (FIG. 3) of the sacrificial liner 118 adjacent the bottom spacer layer 114 while the adjacent portions of the sacrificial liner 118 are protected by the spacer 124. In some illustrative embodiments, the portion of the bottom spacer layer 114 beneath the horizontal portion 118a of the sacrificial liner 118 is also removed. A dielectric fill such as a low temperature oxide is deposited within the spacer 124 through conventional processes to form an oxide pillar 126 between the vertical fins 104-1, 104-2. The oxide pillar 126 may define a dimension which is less than interlayer dielectric materials and/or dummy gate structures used in conventional processes. It is also noted that no insulative material or pillar is deposited between the longitudinally adjacent vertical fins 104-1 of the first pair or between the longitudinally adjacent vertical fins 104-2 of the second pair.

Figure 5:
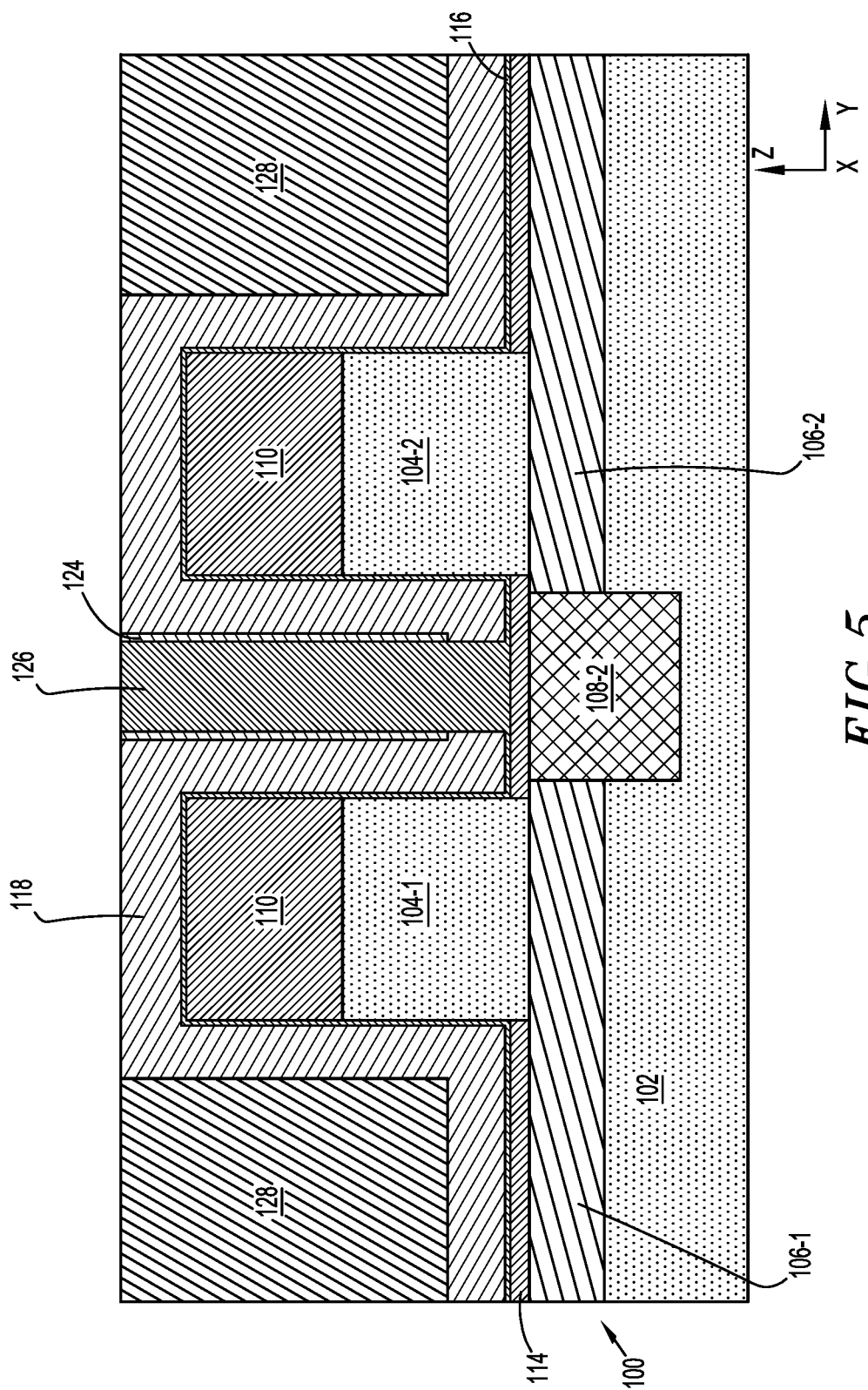

Referring now to FIG. 5, the remaining organic planarization layer (OPL) 120 is removed via an ash etching process. The etching material can be an oxygen ash or a nitrogen or hydrogen-based chemistry including, e.g., nitrogen gas or hydrogen gas, or a combination thereof. The ash etching process removes the organic planarization layer (OPL) 120 with little or no gouging of the underlying components of the semiconductor structure 100. Thereafter, a dielectric fill material 128 comprising an amorphous silicon (a-Si) is deposited on the substrate 102 to fill in the areas which are open resulting from the removal of the organic planarization layer (OPL) 120. The dielectric fill material 128 may be deposited using known dry deposition techniques such as ALD, physical vapor deposition (PVD), CVD or wet deposition techniques such as electroplating, and electroless plating, etc. Thereafter the dielectric fill material 128 is subjected to a planarization process, e.g., such as a chemical-mechanical polish (CMP) process utilizing a suitable etch slurry. The dielectric fill material 128 forms at least part of the "dummy gate" which is subsequently removed for deposition of the high-k metal gate (HKMG) stack.

With reference now to FIGS. 6-7, the hardmask fin caps 110 on the vertical fins 104-1, 104-2 are selectively removed via a conventional etching process. In addition, the oxide layer 116 is selectively recessed relative to the upper surface of the semiconductor structure 100, specifically, to be coplanar with the upper end of the vertical fins 104-1, 104-2. Thereafter, the semiconductor structure 100 is capped via deposition of a capping material 130 such as silicon carbide (SiC). The capping material 130 is subjected to a CMP process to recess the capping material 130 to be even or coplanar with the upper surface of the semiconductor structure 100.

Figure 8:
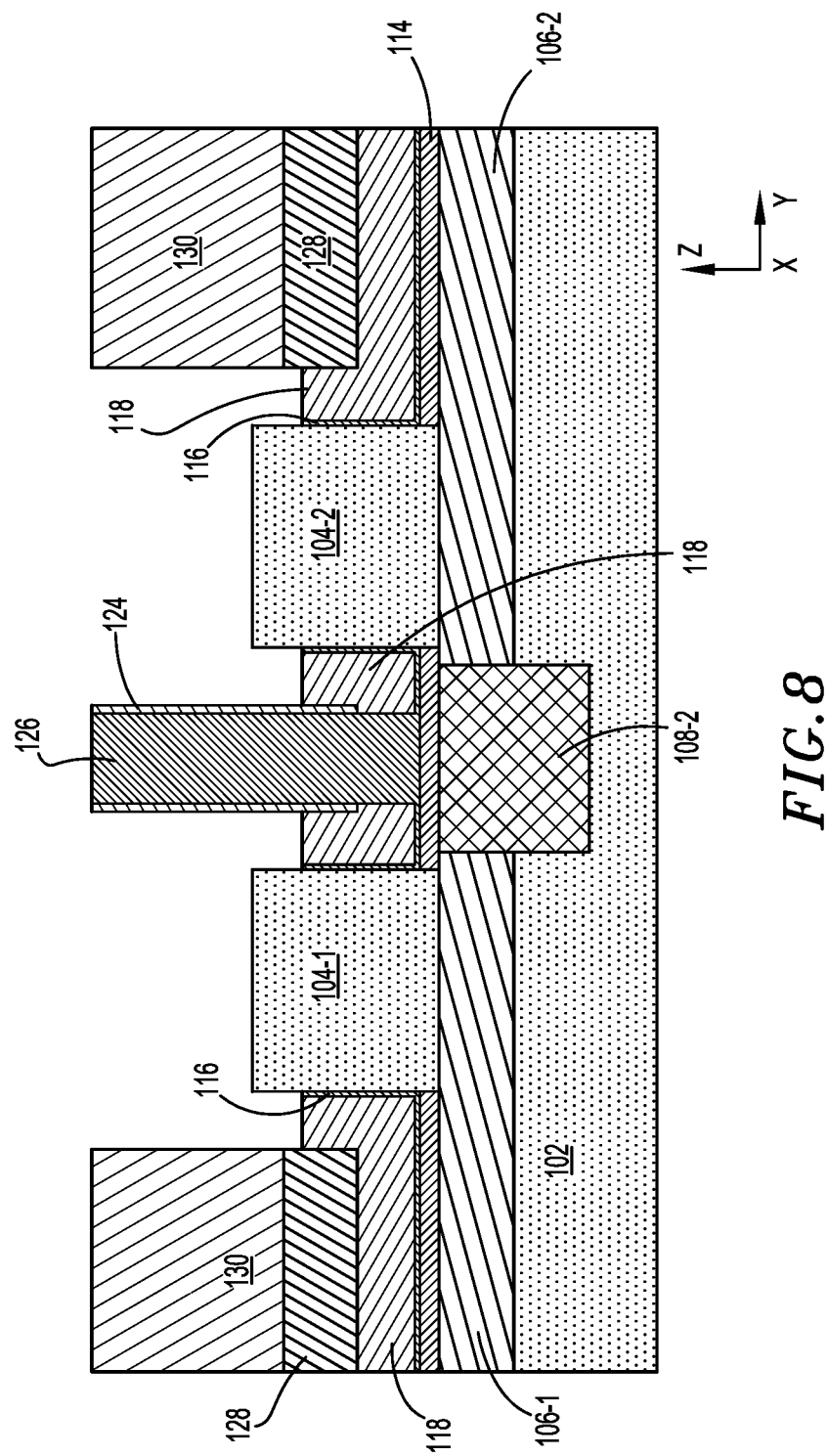

Referring now to FIG. 8, the oxide layer 116 and the sacrificial liner 118 are subjected to a selectively controlled isotropic etch process to position the oxide layer 116 and the sacrificial liner 118 below the vertical fins 104-1, 104-2 and below the fill material 128. The disposition of the upper surface of the sacrificial liner 118 below the dielectric fill material 128 provides advantages with respect to uniform gate length (Lg) definition. More specifically, the vertical component of the sacrificial liner 118 ultimately defines the gate length.

Referring now to FIGS. 9-10, a top spacer 132 comprising silicon nitride (SiN), silicon oxycarbonitride (SiOCN), or boron-modified silicon carbonitride (SiBCN) is deposited on the remaining exposed surfaces of the sacrificial liner 118 adjacent the vertical fins 104-1, 104-2. The top spacer 132 may be deposited via any of the aforementioned directional deposition techniques. Thereafter, an enclosed inner spacer 134 is formed on the top spacer 132, e.g., around the periphery of the top surface of the top spacer 132. The inner spacer 134 may be about 3 nm in thickness although other thicknesses are contemplated. The inner spacer 134 may include a dielectric/insulating material such as silicon nitride (SiN) and/or silicon oxide ($SiO_2$), and is formed using well-known deposition and etching techniques. In one illustrative embodiment, the inner spacer 134 is formed by depositing a conformal spacer layer, and performing a RIE process to form the generally cylindrical shape of the inner spacer 134.

Thereafter, the top source/drain regions 136-1, 136-2 may be formed sequentially on the top spacers 132 enclosed within the inner spacers 134 on each fin 104-1, 104-2. For example, the top source/drain regions 136-1, 136-2 may include one or more epitaxial layers formed via epitaxial growth processes or be formed by incorporating N-type and P-type dopants as described hereinabove in connection with the bottom source/drain regions 106-1, 106-2. The top source/drain regions 136 may be n-doped and/or p-doped. For exemplative purposes, the top source/drain regions 136-1, 136-2 of FIG. 10 may be n-doped and p-doped, respectively. A dielectric material such as silicon nitride (SiN) and/or silicon oxide ($SiO_2$) is deposited onto the top source/drain regions 136-1, 136-2 via known deposition processes, and the dielectric material is subjected to a CMP process to form an epi-cap 138 on each of the top source/drain regions 134. The dielectric material of the inner spacer 134 and the epi-cap 138 may be the same material as shown or include different materials.

Figure 11:
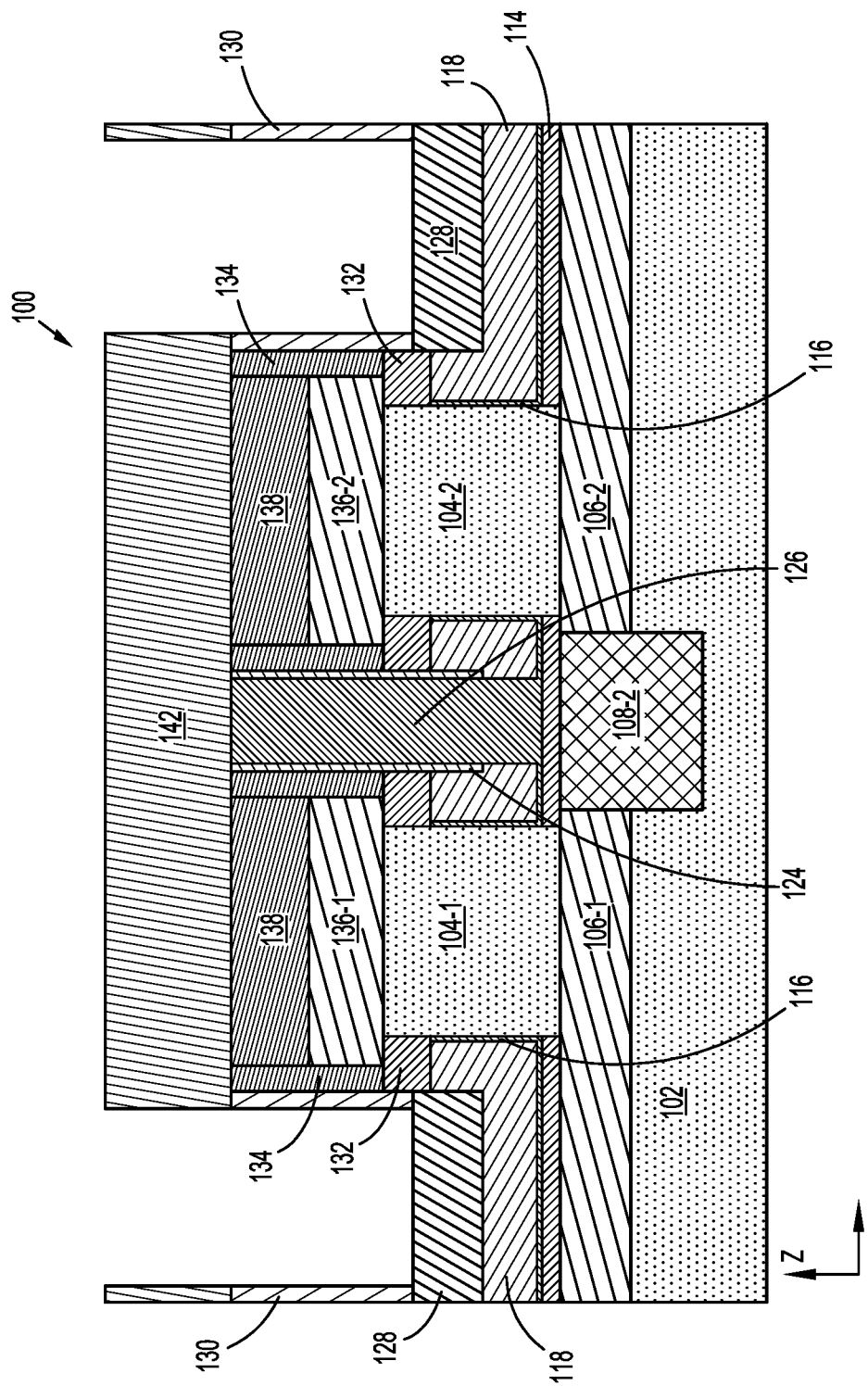

Thereafter, with reference to FIG. 11, a sacrificial layer 142 of, e.g., OPL, is deposited on the semiconductor structure 100 followed by removal of the interior of the capping material 130 on the top source/drain regions 136-1, 136-2 via conventional lithographic and etching processes. The processes are controlled to maintain an inner and outer ring of the capping material 130 as shown. In one illustrative embodiment, the capping material 130 separating the longitudinally adjacent vertical fins 104-1 of the first pair (FIG. 9) may be removed if the structure (including the pair of fins 104-1, 104-1) is to be a "single fin VFET device." Alternatively, the capping material 130 may remain separating the longitudinally adjacent vertical fins 104-1 of the first pair if the structure is to be a "double fin VFET device."

Next, with reference to FIGS. 12-13, the a-Si dielectric fill material 128 and the sacrificial liner 118 are removed from the semiconductor structure 100 by, e.g., hot ammonia or dry vapor HCl application processes, or a combination of both. The oxide layer 116 can be removed with one or more processes including diluted hydro-fluoric acid (DHF), or a chemical oxide removal (COR) process. In addition, the base or bottom segment of the oxide pillar 126 is also subjected to one or more of the aforementioned etching processes, e.g., a wet etching process, to reduce the cross-sectional dimension of the base section of the oxide pillar 126 thereby forming a recessed region 126a. The recessed region 126a may define a diameter which ranges from about 10% to about 70% of the rest of the oxide pillar 126. This facilitates subsequent work metal distribution and gate contact landing by increasing the surface area for reception of subsequent deposition of the metal gate material as will be discussed.

Referring now to FIGS. 14-15, a gate dielectric layer including, e.g., a conformal high-k liner 144, is deposited onto the semiconductor structure 100. The high-k liner 144 may be formed by depositing one or more conformal layers of dielectric material over the surface of the semiconductor structure 100. The high-k liner 144 may comprise a high-k dielectric material having a dielectric constant of about 3.9 or greater. In illustrative embodiments, the high-k liner 144 includes, but is not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k liner 144 may further include dopants such as lanthanum, aluminum. In one embodiment of the disclosure, the conformal high-k liner 144 is formed with a thickness in a range of about 0.5 nm to about 2.5 nm, which will vary depending on the target application. The high-k liner 144 is deposited using known methods such as atomic layer deposition (ALD), e.g., which allows for high conformality of the gate dielectric material.

Thereafter, a high-k chamfer process is employed whereby the semiconductor structure 100 is overfilled with OPL (not shown) to cover the deposited high-k liner 144. The chamfering process (incorporating, e.g., lithography and etching processes) also removes or recesses the upper portion of the high-k liner 144 whereby the high-k liner 144 at least covers portions of the first and second vertical fins 104-1, 104-2, the recessed region 126a of the oxide pillar 126 and the lower surface 132a of the top spacer 132. The chamfering may be, e.g., an amount greater than a chemical mechanical polishing margin, but is controlled not to reach the surface of the vertical fins 104-1, 104-2 underlying the high-k material of the high-k liner 144.

Referring still to FIGS. 14-15, a first work function metal 146 is deposited onto the semiconductor structure 100, i.e., within or over the high-k liner 144, including the "n-type side," represented as "n+," and over the "p-type side," represented as "p+" in FIG. 15. The first work function metal 146 may be formed by depositing a conductive material including, but not limited to titanium nitride (TiN), titanium aluminium nitride (TiAlN) and/or combinations thereof. Other suitable materials include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of such conductive materials. In embodiments, the first work function metal 146 includes one or more of TiN, TiAlC or combinations thereof. The first work function metal 146 may further comprise dopants that are incorporated during or after deposition. The first work function metal 146 is deposited using a suitable deposition process, e.g., CVD, plasma-enhanced chemical vapor deposition (PECVD), PVD, plating, thermal or c-beam evaporation, sputtering, etc. The first work function metal 146 is enclosed within the high-k liner 144 and forms the "n-type" work function. The first work function metal 146 also resides within the open provided by the narrow neck recessed region 126a (FIG. 13) of the oxide pillar 126 surrounded by the high-k liner 144, which substantially improves contact with a subsequently deposited gate contact. A high temperature anneal may be performed.

As specifically noted in FIG. 14, there is sufficient spacing "S" to fill enough of the first work function metal 146 between the pair of vertical fins 104-1 even with a small fin pitch "FP" (FIG. 1), e.g., even as small as 32 nm. This is due to the fact that no isolation dielectric layer or pillar is required between the longitudinally adjacent vertical fins 104-1 (and/or the longitudinally adjacent vertical fins 104-2) during the early stages of fabrication thereby eliminating any pinch off between the vertical fins-104-1 and such isolation pillar. More specifically, at this point in the fabrication process, the work function metal 146 freely enters and fills the space or void between the longitudinally aligned vertical fins 104-1 of the first pair and between the longitudinally aligned vertical fins 104-2 of the second pair.

Figure 16:
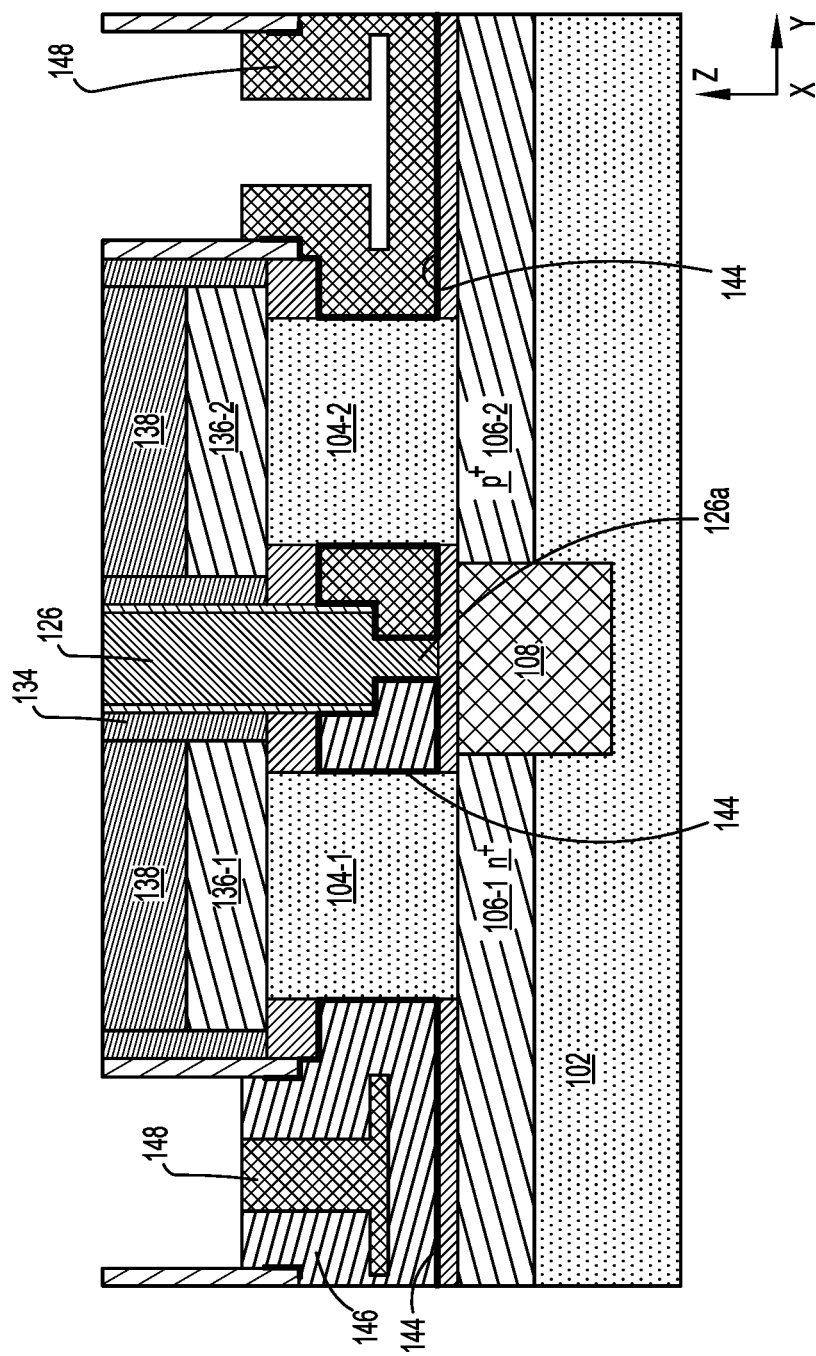

Referring now to FIG. 16, a photomask (not shown), including, e.g., OPL material, is deposited onto the first work function metal 146 on the "n-type" VFET region of the semiconductor structure 100. The first work function metal 146 on the "p-type" VFET region is removed via an isotropic etching process selective to the oxide pillar 126. The presence of the oxide pillar 126, specifically, recessed region 126a ensures that there is no metal undercut of the first work function metal 146 during the etching process. The photomask may be removed from the "n-type" side of the semiconductor structure 100. Thereafter, a second work function metal 148 is deposited on the semiconductor structure 100. The second work function metal 148 may be the same material or a different material from the first work function metal 146, and may be deposited in accordance with the methodologies described hereinabove in connection with the first work function metal 146. In embodiments, the second work function metal 148 forms the "p-type" work function and is different from the first work function metal 146. In embodiments, the second work function metal 148 includes TiN. In other illustrative embodiments, the first and second work function metals 146, 148 may be the same.

Figure 17:
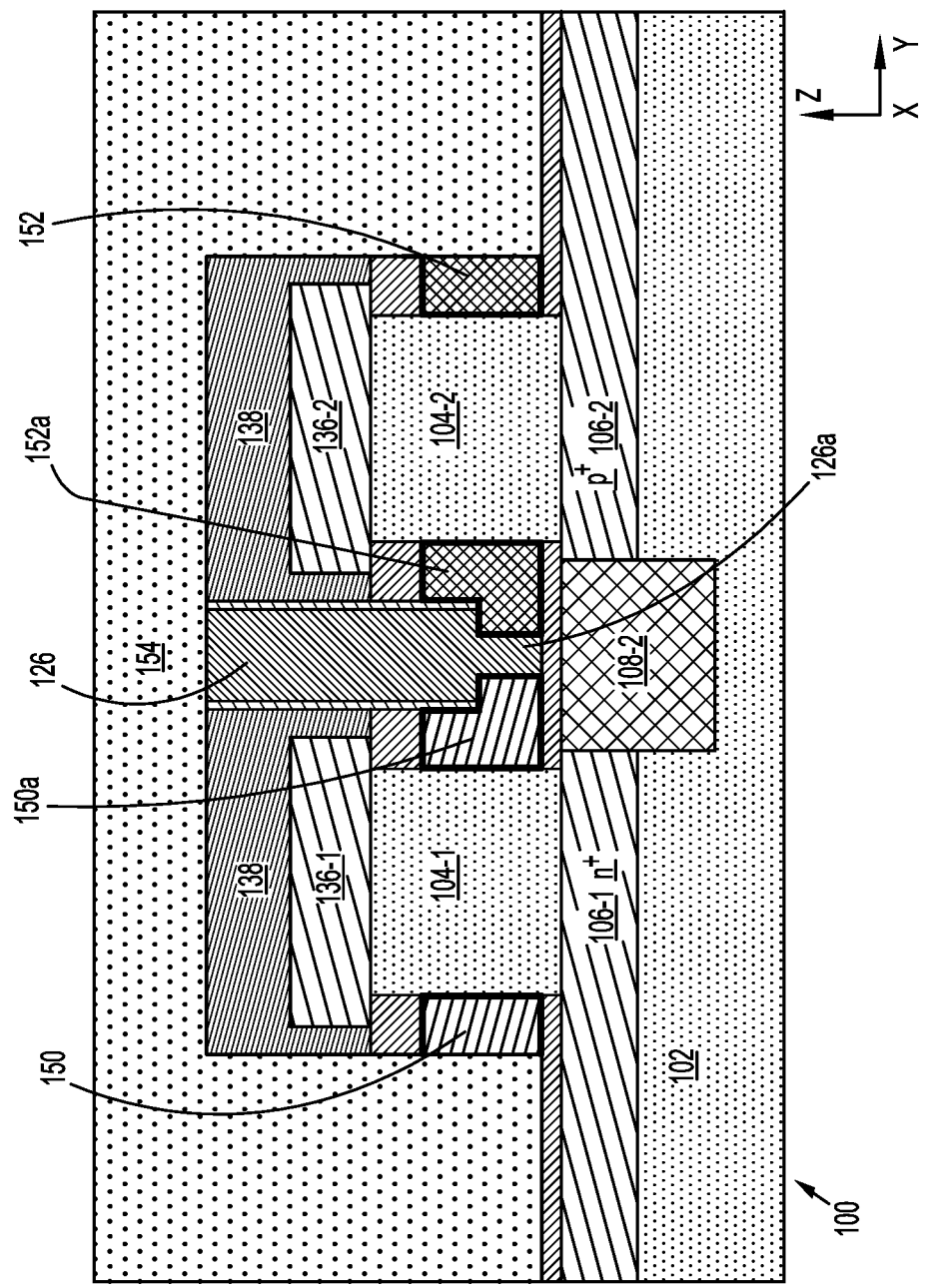

Referring now to FIG. 17, the semiconductor structure 100 is subjected to an etch process, e.g., an RIE etching process, using the epi-caps 138 as hardmasks to remove portions of the first and second work function metal 146, 148 and the high-k liner 144 thereby forming respective high-k metal gate (HKMG) stacks or conductive first and second metal gate structures 150, 152 about the vertical fins 104-1, 104-2 of the semiconductor structure 100. As shown, each of the first and second metal gate structures 150, 152 include gate segments 150a, 152a defining a L-shaped profile. The L-shaped profile increases the surface area upon which a gate contact will be deposited. Moreover, the L-shaped gate segments 150a, 152a are adjacent each other and are configured to define an increased landing area for the subsequently deposited gate contact. The first and the second metal gate structures 150, 152 and the respective portions of high-k liner 144 each defines respective high-k metal gate (HKMG) stacks or conductive gate electrodes of the semiconductor structure 100.

In one embodiment, the SiC capping material 130 between the top source/drain regions 136-1 may be removed via a selective removal, e.g., an etching process. Thereafter, the capping material 130 and the section of the first work function metal 146 between the vertical fins 104-1 of the first pair may be removed to isolate the individual vertical fins 104-1 and accompanying gate structures creating single fin devices. If, however, a multi-fin device is intended, e.g., including two or more vertical fins, the capping material 130 and the work function metal 146 are not removed as will be illustrated in further detail hereinbelow.

Figures 18, 19:
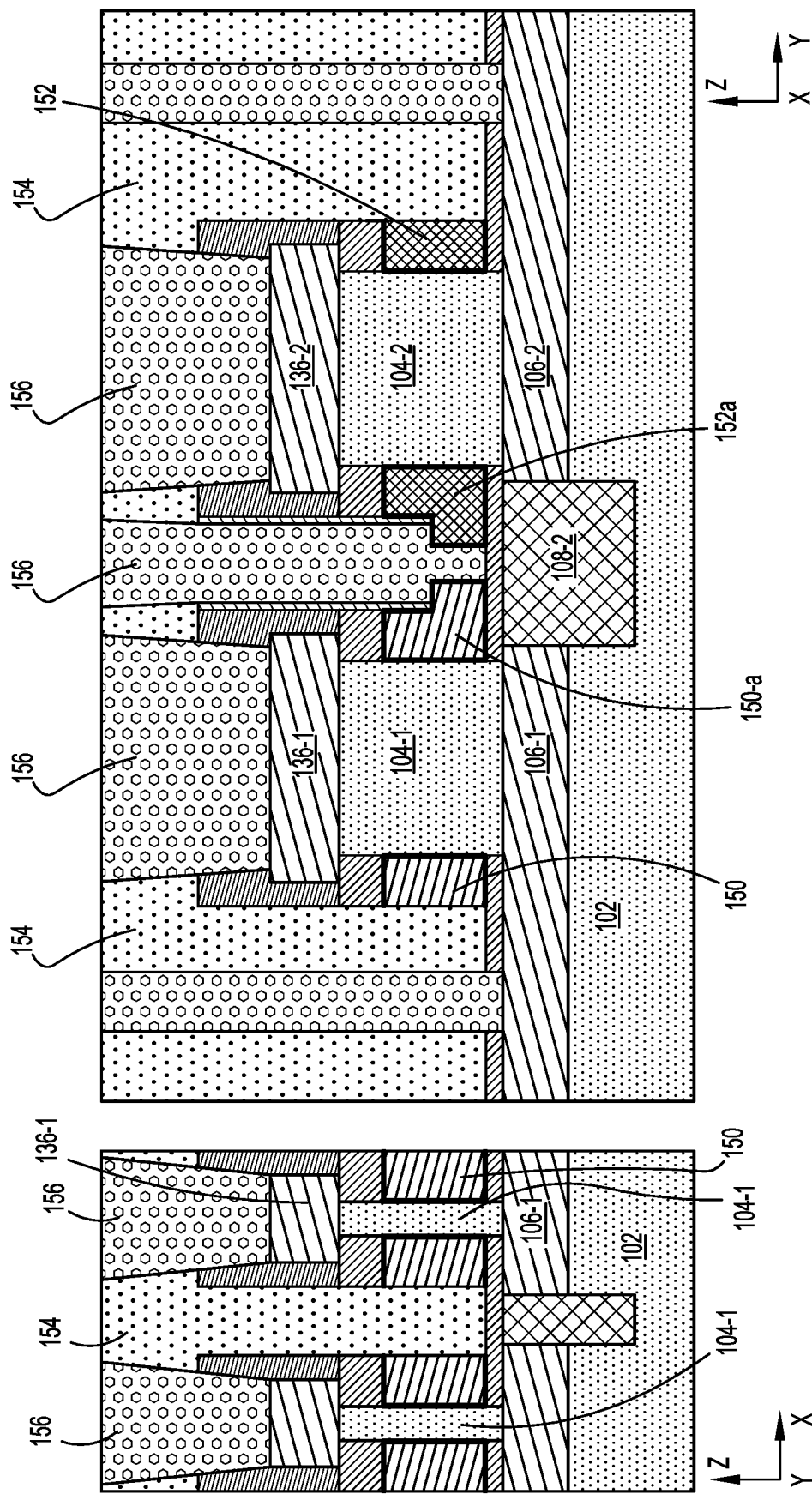

Following the formation of the semiconductor structure 100 shown in FIG. 17, any known sequence of processing steps can be implemented to complete the fabrication of the VFET device, the details of which are not needed to understand embodiments of the disclosure. Briefly, by way of example, an interlayer dielectric 154 is deposited on the semiconductor structure 100. Thereafter, using, e.g., known lithographic and etching processes, the oxide pillar 126 and at least portions of the epi-caps 138 are removed and the trenches and/or via openings are formed in a known manner. The trenches and/or via openings are filled with conductive material to form the gate contacts 156 as depicted in FIGS. 18-19. FIG. 18 illustrates the aforedescribed removal of the capping material 130 and the work function metal 146 between the longitudinally adjacent vertical fins 104-1 and also depicts the interlayer dielectric 154 disposed between the longitudinally adjacent vertical fins 104-1 creating an isolation pillar, thereby forming two single fin devices. Thus, the isolation pillar separating the longitudinally adjacent vertical fins 104-1 is formed after the work function metal is freely deposited into the spacing between the vertical fins 104-1 and the vertical fins 102. FIG. 19 illustrates a "CB contact structure," or gate contact 156, extending between the first and second vertical fins 104-1, 104-2 and engaging the increased landing area defined by the L-shaped segments 150a, 152a of the metal gate structures 150, 152. The removal of the oxide pillar 126 defines a trench which provides for self-alignment of the CB gate contact 156 relative to the STI region 108-2 and the bottom source/drain regions 106-1, 106-2.

Following formation of the gate contacts 156, a BEOL (back end of line) interconnect structure is formed to provide connections to/between the VFET devices and other active or passive devices that are formed as part of the FEOL layer.

Figure 20:
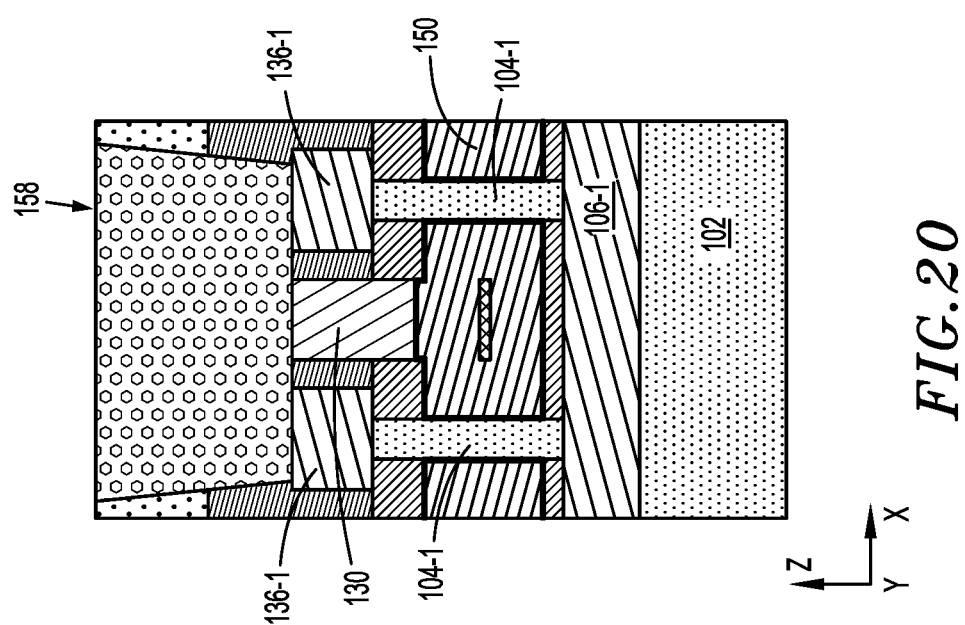

FIG. 20 illustrates a two-fin device 158 within the region occupied by the first pair of fins 104-1 in which the SiC capping material 130 (FIG. 13) and the work function metal 146 are not removed. In this embodiment, the capping material 130 would be provided with a hardmask to protect it from the etching processes. Also, the shallow trench isolation (STI) region between the bottom source/drain regions 106-1 may be removed, or not provided, during the early stages of fabrication of the semiconductor structure 100.

The illustrative methodology for forming a semiconductor structure described herein addresses scaling concerns by enabling the formation of a replacement metal gate structure at a fin pitch as low as 32 nm, facilitating work function metal patterning and providing for self-alignment of subsequently deposited gate contacts. No isolation pillar is required during the initial stages of fabrication thereby permitting free deposition of the work function metals between longitudinally adjacent pairs of vertical fins 104-1, 104-2. Moreover, in illustrative embodiments, the methodologies and materials utilized herein enable function metal patterning in an n-to-p space, i.e., the spacing between the vertical fins 104-1, 104-2 within the respective n-type VFET and p-type VFET regions, as low as 32 nm.

It is to be understood that the methods discussed herein for fabricating VFET devices with uniform structural profiles can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present disclosure can be employed in applications, hardware, and/or electronic systems. Suitable hardware and systems for implementing the disclosure may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the disclosure provided herein, one of ordinary skill in the art will be able to contemplate other implementations and applications of the techniques of the disclosure.

Although exemplary embodiments have been described herein with reference to the accompanying figures, it is to be understood that the disclosure is not limited to those precise embodiments, and that various other changes and modifications may be made therein by one skilled in the art without departing from the scope of the appended claims.

The invention claimed is:

1. A method for fabricating a semiconductor device, comprising:
   forming a semiconductor structure, including a substrate defining a longitudinal axis, a first vertical fin and a second vertical fin longitudinally spaced from the first vertical fin, each of the first and second vertical fins having a hardmask cap and a bottom spacer layer on the substrate;
   forming a first bottom source/drain within the substrate beneath the first vertical fin and a second bottom source/drain within the substrate beneath the second vertical fin;
   forming a first top source/drain on the first vertical fin and a second top source/drain on the second vertical fin;
   forming a vertical oxide pillar between the first and second vertical fins;
   removing a portion of the oxide pillar to reduce a cross-sectional dimension of a lower end of the oxide pillar to define a recessed region of the oxide pillar;
   depositing at least one metal gate material about the first and second vertical fins to form first and second metal gate structures about respective first and second vertical fins, wherein portions of the at least one metal gate material are disposed within the recessed region of the oxide pillar to form a first gate segment of the first metal gate structure and a second gate segment of the second metal gate structure;
   removing a remaining portion of the oxide pillar to form a trench opening extending to the first and second metal gate segments; and
   depositing a conductive contact material within the trench opening to form a gate contact, the gate contact coupled with both the first and second gate segments of the first and second metal gate structures.

2. The method of claim 1, including, prior to depositing the gate material, depositing an oxide layer and a sacrificial liner onto the semiconductor structure including at least the first and second fins and the bottom spacer layer.

3. The method of claim 2, including, prior to forming the oxide pillar, depositing a spacer between the first and second fins, wherein forming the oxide pillar includes depositing oxide fill material within the spacer.

4. The method of claim 3, wherein removing a portion of the oxide pillar includes protecting the remaining portion of the oxide pillar with the spacer.

5. The method of claim 4, wherein removing a portion of the oxide pillar includes utilizing a selective oxide etching process.

6. The method of claim 4, including depositing a gate dielectric layer onto the semiconductor structure including on at least portions of the bottom spacer layer, at least portions of the first and second vertical fins and the recessed region of the oxide pillar.

7. The method of claim 6, wherein the gate dielectric layer includes a conformal gate high-k liner.

8. The method of claim 6, including removing the hardmask cap on each of the first and second vertical fins, and recessing the oxide layer and the sacrificial liner to a position below the first and second vertical fins.

9. The method of claim 8, including depositing a capping material onto exposed portions of the sacrificial liner, and thereafter removing the oxide layer and the sacrificial liner prior to depositing the at least one metal gate material.

10. The method of claim 9, wherein forming the semiconductor structure includes forming first and second pairs of the first and second vertical fins, the first vertical pins of the first pair being longitudinally adjacent to each other, the second vertical fins of the second pair being longitudinally adjacent to each other.

11. The method of claim 10, wherein depositing a capping material includes disposing the capping material between the top source/drains of the first vertical fins of the first pair, the capping material being spaced from the bottom spacer layer wherein, upon removing the oxide layer and the sacrificial liner, a void is created extending continuously between the first vertical fins of the first pair below the capping material.

12. The method of claim 11, wherein upon depositing the at least one metal gate material, the metal gate material extends across the void.

13. The method of claim 12, including:
   removing the capping material; and
   opening and filling one or more additional trenches and/or via openings within the semiconductor structure with conductive material;
   wherein the first fins of the first pair form a single fin device.

14. The method of claim 1, wherein the first and second gate segments each define a L-shaped profile adjacent respective first and second vertical fins, the first and second gate segments defined by the recessed region of the oxide pillar.

15. A method for fabricating a semiconductor device, comprising:
   forming a first vertical fin and a second vertical fin on a substrate of a semiconductor structure, the substrate defining a longitudinal axis, the first and second vertical pins being longitudinally spaced;

forming a first metal gate structure around the first vertical fin and a second metal gate structure around the second vertical fin, each of the metal gate structures having a gate segment defining a L-shaped profile configured to increase surface area for landing of a gate contact;

creating a trench at least partially through the semiconductor structure between the first and second vertical fins; and depositing a conductive contact material within the trench to form a gate contact, the gate contact coupled with both of the gate segments of the first and second metal gate structures.

16. The method of claim 15, wherein the first and second metal gate structures are each high-k metal gates.

17. The method of claim 15, wherein the gate segment of the first metal gate structure is adjacent to the gate segment of the second metal gate structure.

18. The method of claim 15, further comprising:

forming a vertical oxide pillar between the first and second vertical fins;

removing a portion of the oxide pillar to reduce a cross-sectional dimension of a lower end of the oxide pillar to define a recessed region of the oxide pillar;

wherein forming the first gate structure and the second gate structure includes depositing at least one metal gate material into the semiconductor substrate whereby the at least one gate material at least partially fills the recessed region of the oxide pillar to at least partially form the gate segments of the first and second metal gate structures.

19. A semiconductor device, comprising:

a substrate including first and second longitudinally spaced vertical fins extending vertically from the substrate;

first and second bottom source/drains beneath the first and second vertical fins, respectively;

a shallow trench isolation region within the substrate between the first and second bottom source/drains;

first and second top source/drains on the first and second spaced vertical fins, respectively; and a first metal gate structure at least partially disposed about the first vertical fin;

a second metal gate structure at least partially disposed about the second vertical fin;

the first and second metal gate structures comprising respective a first and second gate segments each defining an L-shaped profile, the first and second gate segments being adjacent to each other; and a single gate contact extending at least partially through the substrate between the first and second longitudinally spaced vertical fins and contacting both the first and second metal gate segments of the first and second metal gate structures.

20. The semiconductor device of claim 19, wherein the first bottom and top source/drains are within an n-type region and the second bottom and top source/drains are within a p-type region.

* * * * *